(12) United States Patent
Stowell et al.

(10) Patent No.: US 10,566,177 B2
(45) Date of Patent: Feb. 18, 2020

(54) PULSE SHAPE CONTROLLER FOR SPUTTER SOURCES

(71) Applicant: Applied Materials, Inc., Santa Clara, CA (US)

(72) Inventors: Michael Stowell, Loveland, CO (US); Viachslav Babayan, Sunnyvale, CA (US); Jingjing Liu, Milpitas, CA (US); Zhong Qiang Hua, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 54 days.

(21) Appl. No.: 15/349,433

(22) Filed: Nov. 11, 2016

(65) Prior Publication Data

US 2018/0044781 A1 Feb. 15, 2018

Related U.S. Application Data

(60) Provisional application No. 62/375,288, filed on Aug. 15, 2016.

(51) Int. Cl.
*H01J 37/34* (2006.01)
*C23C 14/34* (2006.01)
(Continued)

(52) U.S. Cl.
CPC ...... *H01J 37/3444* (2013.01); *C23C 14/3485* (2013.01); *C23C 14/35* (2013.01);
(Continued)

(58) Field of Classification Search
CPC .. H01J 37/3467; H01J 37/3476; H01J 37/345; H01J 37/3444; C23C 14/3485;
(Continued)

(56) References Cited

U.S. PATENT DOCUMENTS 5,990,668 A * 11/1999 Coleman ............... H01J 37/34
 323/271
6,522,076 B2 * 2/2003 Goedicke ........... H01J 37/3405
 204/192.12
(Continued)

FOREIGN PATENT DOCUMENTS

JP 2004064817 A * 2/2004

OTHER PUBLICATIONS

International Search Report and Written Opinion for PCT/US2017/042653 dated Oct. 26, 2017.

*Primary Examiner* — Michael A Band
(74) *Attorney, Agent, or Firm* — Patterson + Sheridan LLP

(57) ABSTRACT

Embodiments presented herein relate to a pulse control system for a substrate processing system. The pulse control system includes a power source, a system controller, and a pulse shape controller. The pulse shape controller is coupled to the power source and in communication with the system controller. The pulse shape controller includes a first switch assembly and a second switch assembly. The first switch assembly includes a first switch having a first end and a second end. The first switch is configurable between an open state and a closed state. The second switch assembly includes a second switch having a first end and a second end. The first switch is in the closed state and the second switch is in the open state. The first switch in the closed state is configured to allow a pulse supplied by the power source to transfer through the pulse shape controller.

18 Claims, 3 Drawing Sheets

(51) Int. Cl.
*C23C 14/35* (2006.01)
*H01L 21/683* (2006.01)

(52) U.S. Cl.
CPC ........ *H01J 37/345* (2013.01); *H01J 37/3467* (2013.01); *H01J 37/3476* (2013.01); *H01L 21/6831* (2013.01)

(58) Field of Classification Search
CPC ... C23C 14/35; H01L 21/6833; H01L 23/473; H01L 23/427; H01L 2224/16
See application file for complete search history.

(56) References Cited

U.S. PATENT DOCUMENTS

| | | |
|---|---|---|
| 8,470,141 B1 | 6/2013 | Bernick |
| 2008/0135401 A1 | 6/2008 | Kadlec et al. |
| 2010/0276283 A1 | 11/2010 | Muenz et al. |
| 2013/0062198 A1 | 3/2013 | Kouzentsov |
| 2014/0238844 A1 | 8/2014 | Chistyakov |
| 2016/0351356 A1* | 12/2016 | Reich .................. H01H 9/0044 |

* cited by examiner

PULSE SHAPE CONTROLLER FOR SPUTTER SOURCES

CROSS-REFERENCE TO RELATED APPLICATIONS

This application claims priority from U.S. Provisional Application Ser. No. 63/375,288 filed Aug. 15, 2016, which is hereby incorporated by reference in its entirety.

BACKGROUND

Field

Embodiments described herein generally relate to a substrate processing system, and more specifically, to a pulse shape system for use in a processing chamber.

Description of the Related Art

As the semiconductor industry introduces new generations of integrated circuits (ICs) having higher performance and greater functionality, the density of the elements that form those ICs is increased, while the dimensions, size, and spacing between the individual components or elements are reduced. While in the past such reductions were limited only by the ability to define the structures using photolithography, device geometries having dimensions measured in micrometers or nanometers have created new limiting factors, such as the conductivity of the conductive interconnects, the dielectric constant of the insulating material(s) used between the interconnects, etching the small structures or other challenges in 3D NAND or DRAM form processes. These limitations may be benefited by more durable, higher thermal conductivity and higher hardness hardmasks.

During High Power Impulse Magnetron Sputtering (HiPIMS) deposition, 25 μs pulses of up to −2 kV may be applied to the target at a frequency between 2-8 kHz. For a carbon target, currents in a substrate process chamber may spike up to a 150 A peak. For a metal target, currents in the process chamber may spike up to 400 A peak. When the pulse is turned off by a power source, there is enough energy remaining in the system to continue sputter and deposition until the voltage applied to the target is discharged. This can typically last an additional 25 μs. During this discharge, the drop in voltage results in a drop in ion energy. Thus, the low energy ion deposition results in low density films formed on the substrate. The conventional process suffers from particles caused by hard arcs and by micro-arcing on the target surface. Nodules from re-deposition, or impurities, form on the surface of the target, which build up charge and cause micro-discharges that result in particles.

Therefore, there is a need for an improved substrate processing system.

SUMMARY

Embodiments presented herein generally relate to a pulse control system for a substrate processing system. The pulse control system includes a power source, a system controller, and a pulse shape controller. The pulse shape controller is coupled to the power source and in communication with the system controller. The pulse shape controller includes a first switch assembly and a second switch assembly. The first switch assembly includes a first switch having a first end and a second end. The first switch is configurable between an open state and a closed state. The second switch assembly includes a second switch having a first end and a second end. The second switch is configurable between the open state and the closed state. The first switch is in the closed state and the second switch is in the open state. The first switch in the closed state is configured to allow a pulse supplied by the power source to transfer through the pulse shape controller. The controller is configured to change the first switch between the closed state and the open state and the second switch between the open state and the closed state.

In another embodiment, a substrate processing system is disclosed herein. The substrate processing system includes a substrate processing chamber and a pulse control system coupled to the substrate processing chamber. The substrate processing chamber includes a chamber body, a lid assembly, and a substrate support assembly. The chamber body has sidewalls and a bottom. The lid assembly is positioned on the sidewalls forming an interior volume. The lid assembly has a target configured to provide a material source that can be sputtered and deposited onto a surface of a substrate. The substrate support assembly is disposed in the interior volume below the lid assembly. The substrate support assembly is configured to support the substrate during processing. The pulse control system includes a power source, a controller, and a pulse shape controller. The pulse shape controller is coupled to the power source and the substrate processing chamber. The pulse shape controller is in communication with the controller. The pulse shape controller includes a first switch assembly and a second switch assembly. The first switch assembly has a first switch with a first end and a second end. The first end is coupled to the power source and the second end is coupled to the target. The first switch is configurable between an open state and a closed state. The second switch assembly has a second switch having a first end and a second end. The first end of the second switch is coupled to a ground. The second end of the second switch is coupled to the target. The first switch is in the closed state. The second state is in the open state. The first switch in the closed state is configured to allow a pulse supplied by the power source to transfer through the pulse shape controller to the target. The controller is configured to change the first switch between the closed state and the open state and the second switch between the open state and the closed state in response to detecting a pulse peak of the pulse supplied to the target.

In another embodiment, a method of shaping a pulse during high power impulse magnetron sputtering is disclosed herein. A controller initializes a pulse shape controller having a first switch and a second switch, such that the first switch is in a closed state and the second switch is in an open state. The controller determines whether a pulse peak has occurred in response to a pulse provided to a target in a substrate processing chamber through the pulse shape controller. Responsive to determining that a pulse peak has occurred, the controller discharges the target by switching the first switch from the closed state to the open state and the second switch from the open state to the closed state.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
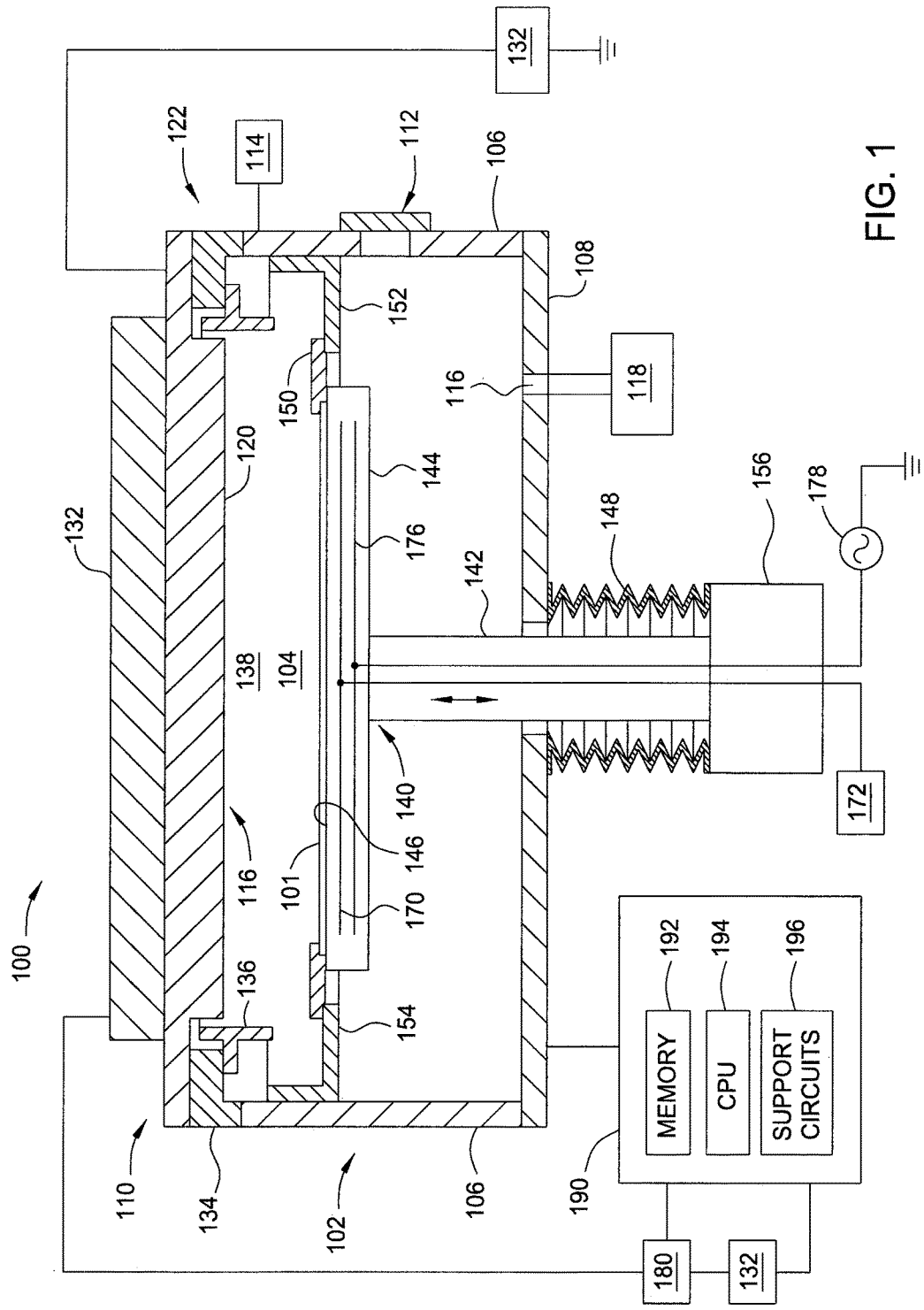
FIG. 1 illustrates a physical vapor deposition (PVD) process chamber suitable for sputter depositing materials using a high power impulse magnetron sputtering (HiPIMS) process, according to one embodiment.

FIG. 1 illustrates a physical vapor deposition (PVD) process chamber 100 (e.g., a sputter process chamber) suitable for sputter depositing materials using a high power impulse magnetron sputtering (HiPIMS) process. The process chamber 100 includes a chamber body 102 defining a processing volume 104. The chamber body 102 includes sidewalls 106 and a bottom 108. A chamber lid assembly 110 is mounted on the top of the chamber body 102. The chamber body 102 may be fabricated from aluminum or other suitable materials. A substrate access port 112 is formed through the sidewall 106 of the chamber body 102, facilitating the transfer of a substrate 101 into and out of the process chamber 100. The access port 112 may be in communication with a transfer chamber, and/or other chambers, of a substrate processing system.

The chamber lid assembly 110 generally includes a target 120 and a ground shield assembly 122 coupled thereto. The target 120 provides a material source that can be sputtered and deposited onto the surface of the substrate 101 during a PVD process. The target 120 serves as the cathode of the plasma circuit during DC sputtering. The target 120 may be fabricated from a material utilized for the deposition layer, or elements of the deposition layer to be formed in the chamber. A high voltage power supply, such as a power source 124 (discussed in more detail in FIG. 2), is connected to the target 120 to facilitate sputtering materials from the target. In one embodiment, the target 120 may be fabricated from a carbon containing material, such as graphite, amorphous carbon, combinations thereof, or the like.

The target 120 generally includes a peripheral portion 126 and a central portion 128. The peripheral portion 126 is disposed over the sidewalls 106 of the chamber 100. The central portion 128 of the target 120 may have a curvature surface slightly extending towards the surface of the substrate 101 disposed on a substrate support 130. In one embodiment, the spacing between the target 120 and the substrate support 130 is maintained between about 50 mm and about 250 mm.

The chamber lid assembly 110 may further comprise a magnetron cathode 132. In one embodiment, the magnetron cathode 132 is mounted above the target 120, which enhances efficient sputtering materials from the target 120 during processing. The magnetron cathode 132 allows efficient process control and tailored film properties, while ensuring consistent target erosion and uniform deposition across the substrate 101.

The ground shield assembly 122 of the lid assembly 110 includes a ground frame 134 and a ground shield 136. The ground shield 136 is coupled to the peripheral portion 126 by the ground frame 134 defining an upper processing region 138 below the central portion 128 of the target 120 in the processing volume 104. The ground frame 134 is configured to electrically insulate the ground shield 136 from the target 120 while providing a ground path to the chamber body 102 of the process chamber 100 through the sidewalls 106. The ground shield 136 is configured to constrain the plasma generated during processing within the upper processing region 138 and dislodges target source material from the confined central portion 128 of the target 120, thereby allowing the dislodged target source material to be mainly deposited on the substrate surface rather than chamber sidewalls 106.

The process chamber 100 further includes a substrate support assembly 140 disposed therein. The substrate support assembly 140 includes a shaft 142 and a substrate support 144 coupled to the shaft 142. The substrate support 144 includes a substrate receiving surface 146 configured to support the substrate 101 during processing. The shaft 142 extends through the bottom 108 of the chamber body 102 and is coupled to a lift mechanism 156. The lift mechanism 156 is configured to move the substrate support 144 between a lower transfer position and an upper processing position. A bellows 148 circumscribes the shaft 142 and is configured to provide flexible seal between the chamber body 102 and the shaft 142.

The substrate support 144 may be an electro-static chuck and have an electrode 170. The substrate support 144, when using the electro-static chuck (ESC) embodiment, uses the attraction of opposite charges to hold both insulating and conducting type substrates 101 and is powered by DC power supply 172. The substrate support 144 can include an electrode embedded within a dielectric body. The DC power supply 172 may provide a DC chucking voltage of about 200 to about 2000 volts to the electrode. The DC power supply 172 may also include a system controller for controlling the operation of the electrode 170 by directing a DC current to the electrode for chucking and de-chucking the substrate 101. Additionally, a bias may be provided to a bias electrode 176 in the substrate support 144 from a source 178, so that the substrate 101 may be bombarded with ions formed in the plasma during one or more phases of the deposition process.

The process chamber 100 may further include a shadow frame 150 and a chamber shield 152. The shadow frame is disposed on the periphery of the substrate support assembly 140. The shadow frame 150 is configured to confine deposition of source material sputtered from the target 120 to a desired portion of the substrate surface. The chamber shield 152 may be disposed on the inner wall of the chamber body 102. The chamber shield 152 includes a lip 154 extending inward, towards to the processing volume 104. The lip 154 is configured to support the shadow frame 150 disposed around the substrate support assembly 140. As the substrate support 144 is raised to the upper position for processing, an outer edge of the substrate 101, disposed on the substrate receiving surface 146, is engaged by the shadow frame 150 and the shadow frame 150 is lifted up and spaced away from the chamber shield 152. When the substrate support 144 is lowered to the transfer position, adjacent to the access port 112, the shadow frame 150 is set back on the chamber shield 152. Lift pins (not shown) are selectively moved through the substrate support 144 to lift the substrate 101 above the substrate support 144 to facilitate access to the substrate 101 by a transfer mechanism.

A gas source 114 is coupled to the chamber body 102 to supply process gases into the processing volume 104. In one embodiment, process gases may include inert gases, nonreactive gases, and reactive gases, if necessary. Examples of process gases that may be provided by the gas source 114 include, but are not limited to, argon gas (Ar), helium (He), neon gas (Ne), krypton (Kr), etc.

The process chamber 100 further includes a pumping port 116 and a pumping device 118. The pumping port 116 may be formed through the bottom 108 of the chamber body 102. The pumping device 118 is coupled to the processing volume 104 to evacuate and control the pressure therein. In one example, the pumping device 118 may be configured to maintain the process chamber 100 at a pressure between about 1 mTorr and about 500 mTorr.

A system controller 190 is coupled to the process chamber 100. The system controller 190 includes a central processing unit (CPU) 192, a memory 194, and support circuits 196. The system controller 190 is configured to control the process sequence, regulating the gas flows from the gas source 114, and controlling ion bombardment of the target 120. The CPU 192 may be of any form of a general purpose computer processor that can be used in an industrial setting. The software routines can be stored in the memory 194, such as random access memory (RAM), read only memory (ROM), floppy or hard disk drive, or other form of digital storage. The support circuits 196 are conventionally coupled to the CPU 192. The software routines, when executed by the CPU 192, transform the CPU into a specific purpose computer (system controller 190) that controls the process chamber 100, such that the processes are performed in accordance with the present disclosure. The software routines may also be stored and/or executed by a second controller (not shown) that is located remotely from the process chamber 100. During processing, material is sputtered from the target 120 and deposited on the surface of the substrate 101. In some configurations, the target 120 is biased relative to the ground or the substrate support 144, by the power source 124 to generate and maintain a plasma formed from the process gases supplied by the gas source 114. The ions generated in the plasma are accelerated toward and strike the target 120, causing target material to be dislodged from the target 120. The dislodged target material forms a layer on the substrate 101 with a desired crystal structure and/or composition. RF, DC, or fast switching pulsed DC power supplies, or combinations thereof, provide tunable target bias for precise control of sputtering composition and deposition rates for the nanocrystalline diamond material.

The process chamber 100 further includes a pulse shape controller 180. The pulse shape controller 180 is positioned between the power source 132 and the target 120. The pulse shape controller 180 is in communication with the system controller 190. During HiPIMS deposition, 25 µs pulses of up to −2 kV may be applied to the target at a frequency between 200 Hz-40 kHz. For a carbon target, currents in the process chamber 100 may spike up to a 150 A peak. For a metal target, currents in the process chamber 100 may spike up to 400 A peak. When the pulse is turned off by the power source 132, there is enough energy remaining in the system to continue sputter and deposition until the voltage applied to the target 120 is discharged. This can typically last an additional 25 µs. During this discharge, the drop in voltage results in a drop in ion energy. Thus, the low energy ion deposition results in low density films formed on the substrate 101. The conventional process suffers from particles caused by hard arcs and by micro-arcing on the target surface. Nodules from re-deposition, or impurities, form on the surface of the target, which build up charge and cause micro-discharges that result in particles. The pulse shape controller 180 is configured to eliminate the unwanted deposition between HiPIMS pulses by discharging the energy between pulses, to eliminate hard arcs that occur at the end of HiPIMS pulses by grounding the system at the end of the pulses, and to mitigate micro-arcing of the target 120 by discharging the target between every pulse, thus increasing the quality of the film formed on the substrate.

Figure 2:
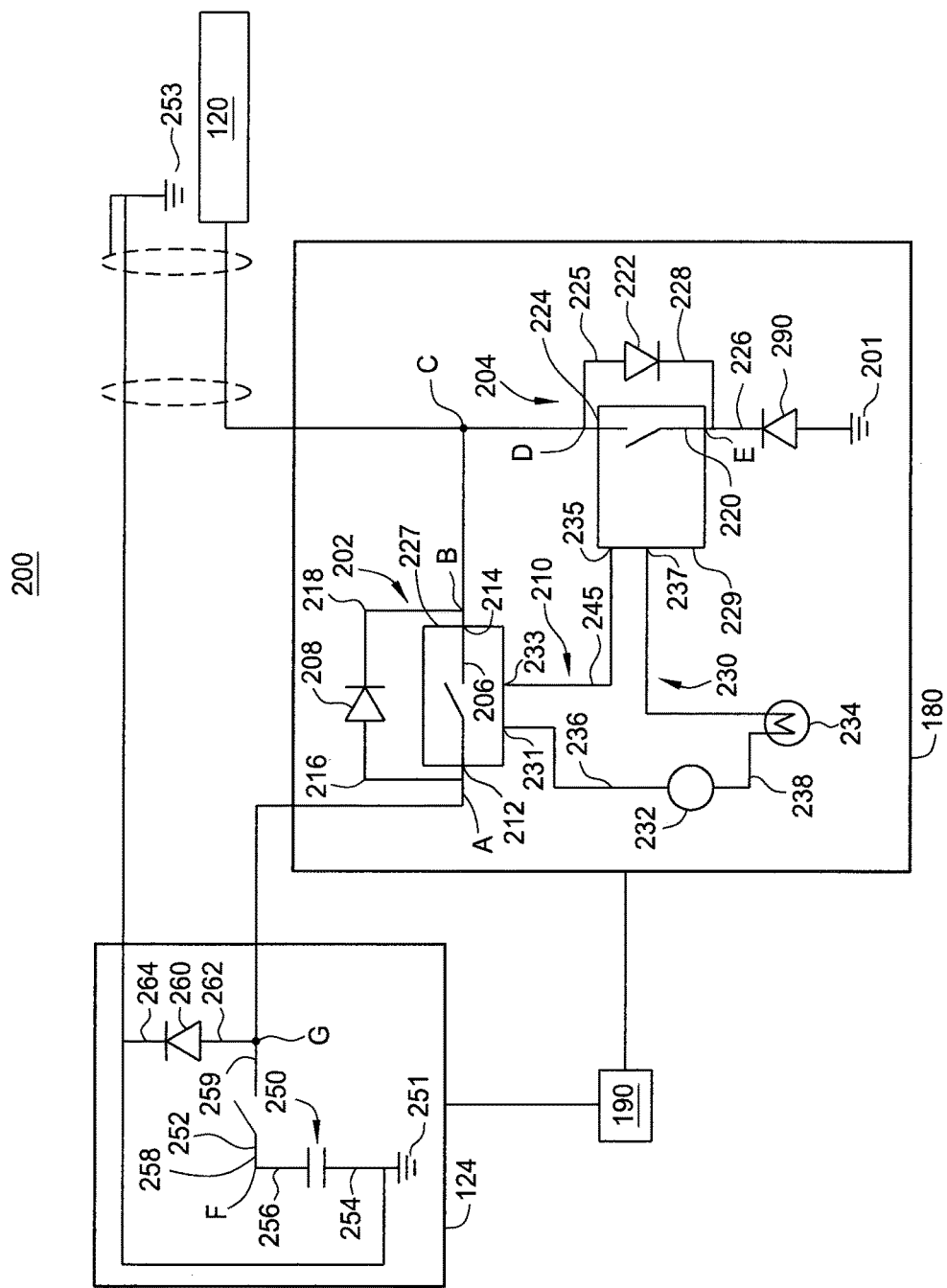
FIG. 2 illustrates a pulse shape controller system, according to one embodiment.

FIG. 2 illustrates a pulse shape controller system 200, according to one embodiment. The pulse shape controller system 200 includes the pulse shape controller 180, the power source 124, and the system controller 190. In this embodiment, the pulse shape controller 180 is shown separate from the system controller 190. In some embodiments, the pulse shape controller 180 may be integrated with the system controller 190.

The pulse shape controller 180 is configured to discharge the plasma generated in the process chamber 100 after an HiPIMS pulse occurs. The pulse shape controller 180 is positioned between the power source 124 and the target 120. The pulse shape controller 180 includes at least a first switch assembly 202, a second switch assembly 204, and a cooling system 210. The first switch assembly 202 includes first switch 206 and a first diode 208. The first switch 206 has a first (e.g., a negative) end 212 and a second (e.g., a positive) end 214. The first end 212 of the switch 206 is coupled to the power source 132. In one example, the power source 132 may be a negative high voltage pulsed DC power supply. The second end 214 of the switch is in electrical communication with the second switch assembly 204. The first diode 208 is placed about the first switch 206. The first diode 208 includes an anode 216 (positive) and a cathode 218 (negative). The anode 216 of the first diode 208 is coupled to the first switch 206 at node A. The cathode 218 of the first diode 208 is coupled to the first switch 206 at node B. In one embodiment, the first switch 206 is configured to withstand a frequency of 50 kHz. The first diode 208 is configured to protect the first switch 206 circuity. For example, by placing the first diode 208 in parallel with the first switch, the first diode 208 ensures that switch 206 is never reverse biased, i.e., voltage at the second end (i.e., positive terminal) 214 of switch 206 is never lower than the first end (i.e., negative terminal) 212 of the switch 206.

The second switch assembly 204 includes a second switch 220 and a second diode 222. The second switch 220 has a first (e.g., negative) end 224 and a second (e.g., positive) end 226. The first end 224 of the switch 220 is coupled to the target 120. The second end 226 of the switch is coupled to ground 201 through a third diode 290. The second diode 222 is placed about the second switch 220. The second diode 222 includes an anode (negative) 225 and a cathode (positive) 228. The anode 225 of the second diode 222 is coupled to the second switch 220 at node D. The cathode 228 of the second diode 222 is coupled to the second switch 220 at node E. In one embodiment, the second switch 220 is configured to withstand a frequency of 50 kHz. The second diode 222 is configured to protect the second switch 220 circuity. For example, by placing the second diode 222 in parallel with the second switch 220, the second diode 222 ensures that the switch 220 is never reverse biased, i.e., voltage at the second end (i.e., positive terminal) 226 of switch 220 is never lower than the first end (i.e., negative terminal) 224 of the switch 220.

The pulse shape controller 180 is coupled to the target 120 at node C. In operation, the pulse shape controller 180 is initially in a first state (i.e., a power delivery state). In the power delivery state, the first switch 206 is in a closed position and the second switch 220 is in the open position.

The power delivery state allows a DC pulse (e.g., a negative DC pulse), generated by the power source 124, to travel through the pulse shape controller 180 and to the target 120. The pulse shape controller 180 may change from the power delivery state to a second state (i.e., a system discharge state) when of the end of the pulse provided to the target is determined. The system discharge state allows the target 120 to be grounded such that the target 120 can be discharged more rapidly, thus decreasing any unwanted deposition that typically occurs during the discharge time. In the system discharge state, the first switch 206 changes from the closed position to the open position, and the second switch 220 switches from the open position to the closed position. In doing so, the opening of the first switch 206 cuts off any voltage applied to the target 120, and also puts the target 120 in electrical communication with ground 201 in the pulse shape controller 180.

In one embodiment, the pulse shape controller 180 may further include a cooling system 210. The cooling system 210 is configured to protect the switches 206, 220 from becoming overheated by flowing a cooling fluid through each switch 206, 220. The cooling system 210 includes a first housing 227 disposed about the first switch 206 and a second housing 229 disposed about the second switch 220. The first housing 227 includes an inlet 231 and an outlet 233. The second housing 229 includes an inlet 235 and an outlet 237. The cooling system 210 includes one or more fluid conduits 230, a pump 232, and a heat exchanger 234. A first fluid conduit 236 from the one or more fluid conduits 230 may extend between the first housing 227 and the pump 232. For example, the first fluid conduit 236 extends from the pump to the inlet 231 of the first housing 227. A second fluid conduit 238 extends from the pump 232 to the heat exchanger 234. In one embodiment, a heat exchanger may be positioned between the pump 232 and the outlet 237. A third fluid conduit 240 may extend between the first housing 227 and the second housing 229. The third fluid conduit 240 couples the outlet 233 of the first housing 227 to the inlet 235 of the second housing 229. As constructed, a cooling fluid may flow about the first and second switches 206, 220 to maintain a desired temperature during processing.

As mentioned, the pulse shape controller is connected to the power source 124 which generates the pulse to be sent to the target 120. The power source 124 includes a DC power supply 250 and a switch 252. The DC power supply 250 includes a first (e.g., positive) end 254 and a second (e.g., negative) end 256. The first end 254 is coupled to ground 251. The second end 256 is coupled to a first end 258 of the switch 252 at node F. The second end 259 of the switch 252 is in communication with the pulse shape controller 180. In another embodiment, the power source 124 further includes a diode 260. The diode 260 includes an 262 in communication with the switch at node G and a cathode 264 in communication with ground 251 and ground 253. The diode 260 is configured to protect the power supply from reverse bias so that the negative terminal G is never higher than the ground terminal of the power source 132.

Figure 3:
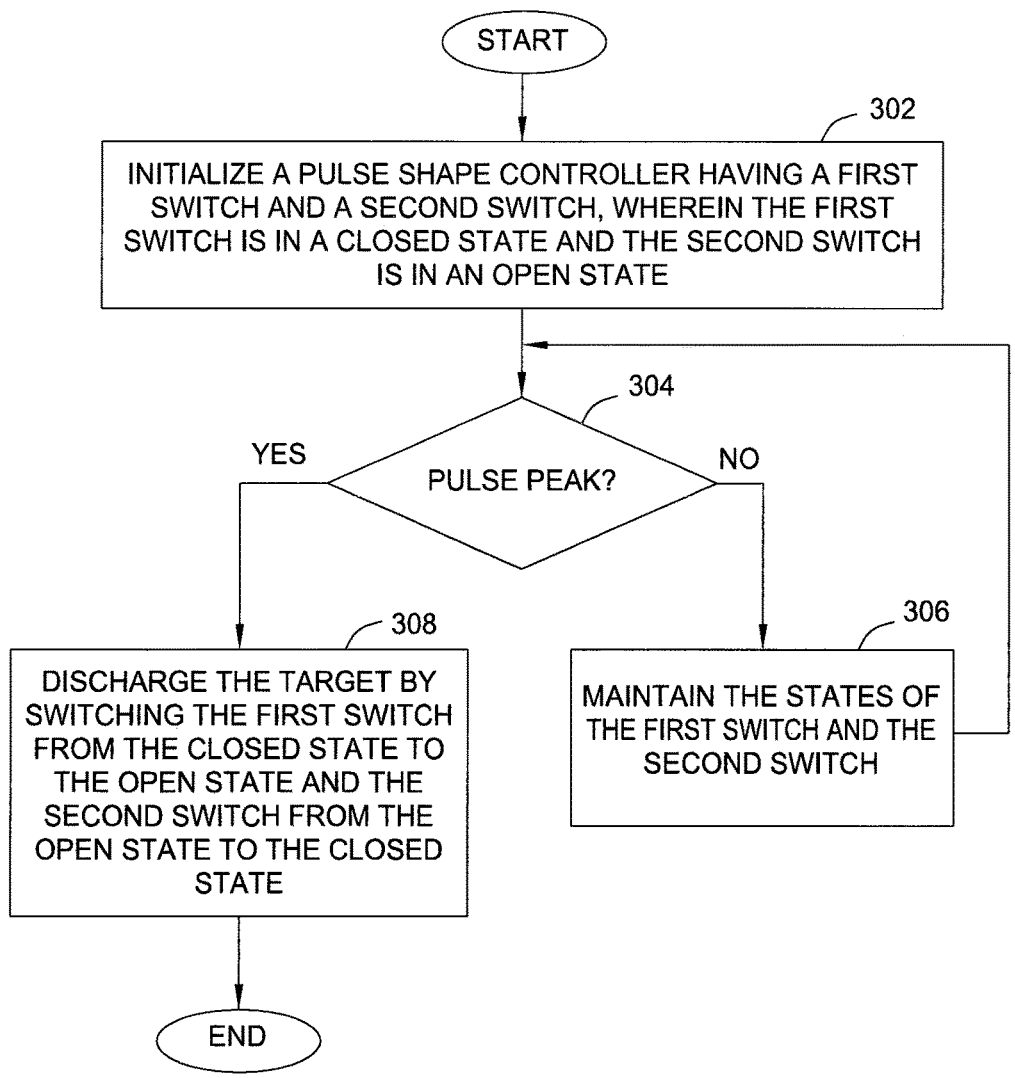
FIG. 3 illustrates assembly method of shaping a pulse in HiPIMS deposition, according to one embodiment.

FIG. 3 illustrates a method 300 of shaping a pulse in HiPIMS deposition, according to one embodiment. At block 302, the system controller 190 initializes the pulse shape controller 180 to an initial position. In the initial position, the first switch 206 is in the closed position and the second switch 220 is in the open position. Thus, the system controller 190 initializes the pulse shape controller 180 to allow a pulse generate by the power source to travel through the pulse shape controller 180 and to the target 120.

At block 304, the system controller 190 determines whether a pulse peak has occurred. For example, the system controller 190 will monitor the voltage applied to the target 120, and determine when a pulse peak occurs. If the system controller 190 determines that the pulse peak has not occurred, the system controller 190 does not change the position of the pulse shape controller, i.e., the system controller 190 maintains the pulse shape controller 180 in the initial position to allow voltage to be applied to the target 120 (block 306). If the system controller 190 determines that the pulse peak has occurred, the controller changes the position of the pulse shape controller, i.e., the controller changes the pulse shape controller 180 from the initial position to a secondary position (block 308). In the secondary position, the first switch 206 is switched from the closed position to the open position and the second switch 220 is switched from the open position to the closed position. In the secondary position, to the power source 132 is disconnected from the target 120 because the first switch 206 is in the open position. Instead, the target 120 is grounded by electrically coupling the target 120 to ground when the second switch 220 is in the closed position. By grounding the target 120, the target 120 is discharged more rapidly. This results in a decrease in the deposition rate because there is no longer unwanted deposition between pulses. Additionally, the density of the film is increased because there is no longer a low energy deposition between pulses. Moreover, in some cases, the second switch can be connected to a positive voltage DC power supply between about 0-200V instead of ground to help further with discharge of the target, as well as repelling positive ions into the substrate to improve material density.

While the foregoing is directed to specific embodiments, other and further embodiments may be devised without departing from the basic scope thereof, and the scope thereof is determined by the claims that follow.

What is claimed is:

1. A pulse controlling system, comprising:
    a pulsed DC power source configured to apply a negative voltage to a target;
    a pulse shape controller configured with a first state and a second state, the pulse shape controller comprising:
        a first switch assembly having a first switch and a first diode in parallel with the first switch, wherein the first switch has a first end coupled to the pulsed DC power source and a second end coupled to a node that is directly coupled to the target; and
        a second switch assembly having a second switch and a second diode in parallel with the second switch, wherein the second switch has a first end coupled to the node and a second end coupled to ground,
        wherein when the pulse shape controller is in the first state, the first switch is in a closed position and the second switch is in an open position, and when the pulse shape controller is in the second state, the first switch is in an open position and the second switch is in a closed position; and
    a system controller configured to:
        initialize the pulse shape controller in the first state to allow a pulse generated by the pulsed DC power source to travel through the pulse shape controller and to the target;
        determine whether a pulse end has occurred by monitoring the negative voltage applied to the target; and
        change the pulse shape controller from the first state to the second state when the system controller determines that the pulse end has occurred to discharge the target.

2. The pulse controlling system of claim 1, wherein the pulse shape controller further comprises:
   a cooling system at least partially surrounding the first switch and the second switch.

3. The pulse controlling system of claim 2, wherein the cooling system further comprises:
   a first housing having a first inlet and a first outlet positioned at least partially surrounding the first switch;
   a second housing having a second inlet and a second outlet at least partially surrounding the second switch;
   a pump;
   a first conduit extending between the first housing and the pump;
   a second conduit extending between the pump and the second housing; and
   a third conduit extending between the first housing and the second housing.

4. The pulse controlling system of claim 3, wherein the cooling system further comprises:
   a heat exchanger positioned between the pump and the second housing.

5. A pulse controlling system, comprising:
   a pulsed DC power source configured to apply a negative voltage to a target;
   a pulse shape controller configured with a first state and a second state, the pulse shape controller comprising:
      a first switch assembly having a first switch and a first diode in parallel with the first switch, wherein the first switch has a first end coupled to the pulsed DC power source and a second end coupled to a node that is directly coupled to the target; and
      a second switch assembly having a second switch and a second diode in parallel with the second switch, wherein the second switch has a first end coupled to the node and a second end coupled to ground,
      wherein when the pulse shape controller is in the first state, the first switch is in a closed position and the second switch is in an open position, and when the pulse shape controller is in the second state, the first switch is in an open position and the second switch is in a closed position; and
   a system controller configured to:
      initialize the pulse shape controller in the first state;
      determine whether a pulse peak has occurred by monitoring the negative voltage applied to the target; and
      change the pulse shape controller from the first state to the second state to electrically couple the target to ground when the system controller determines that the pulse peak has occurred to discharge the target.

6. The pulse controlling system of claim 5, wherein the first diode allows a voltage at the second end of the first switch to never be lower than the voltage at the first end of the first switch.

7. The pulse controlling system of claim 5, wherein the second diode allows a voltage at the second end of the second switch to never be lower than the voltage at the first end of the second switch.

8. The pulse controlling system of claim 5, wherein the first switch is in the closed position and the second switch is in the open position for a power delivery state.

9. The pulse controlling system of claim 5, wherein the first switch is in the open position and the second switch is in the closed position for a system discharge state.

10. The pulse controlling system of claim 5, wherein the pulse shape controller further comprises:
   a cooling system at least partially surrounding the first switch and the second switch.

11. The pulse controlling system of claim 10, wherein the cooling system further comprises:
   a first housing having a first inlet and a first outlet positioned at least partially surrounding the first switch;
   a second housing having a second inlet and a second outlet at least partially surrounding the second switch;
   a pump;
   a first conduit extending between the first housing and the pump;
   a second conduit extending between the pump and the second housing; and
   a third conduit extending between the first housing and the second housing.

12. A pulse controlling system, comprising:
   a pulsed DC power source configured to apply a negative voltage to a target;
   a pulse shape controller configured with a first state and a second state, the pulse shape controller comprising:
      a first switch assembly having a first switch and a first diode in parallel with the first switch, wherein the first switch has a first end coupled to the pulsed DC power source and a second end coupled to a node that is directly coupled to the target; and
      a second switch assembly having a second switch and a second diode in parallel with the second switch, wherein the second switch has a first end coupled to the node and a second end coupled to ground,
      wherein when the pulse shape controller is in the first state, the first switch is in a closed position and the second switch is in an open position, and when the pulse shape controller is in the second state, the first switch is in an open position and the second switch is in a closed position; and
   a system controller configured to:
      initialize the pulse shape controller in the first state to allow a pulse generated by the pulsed DC power source to travel through the pulse shape controller and to the target;
      determine whether a pulse end or a pulse peak has occurred by monitoring the negative voltage applied to the target; and
      change the pulse shape controller from the first state to the second state if the system controller determines that the pulse end or the pulse peak has occurred.

13. The pulse controlling system of claim 12, wherein the first switch and the second switch are configured to withstand a frequency of about 50 kHz.

14. The pulse controlling system of claim 12, wherein the first diode allows a voltage at the second end of the first switch to never be lower than the voltage at the first end of the first switch.

15. The pulse controlling system of claim 12, wherein the second diode allows a voltage at the second end of the second switch to never be lower than the voltage at the first end of the second switch.

16. The pulse controlling system of claim 12, wherein the pulse shape controller further comprises:
   a cooling system at least partially surrounding the first switch and the second switch.

17. The pulse controlling system of claim 16, wherein the cooling system further comprises:
   a first housing having a first inlet and a first outlet positioned at least partially surrounding the first switch;
   a second housing having a second inlet and a second outlet at least partially surrounding the second switch;
   a pump;

a first conduit extending between the first housing and the pump;

a second conduit extending between the pump and the second housing; and a third conduit extending between the first housing and the second housing.

18. The pulse controlling system of claim 1, wherein:

the first diode allows a voltage at the second end of the first switch to never be lower than the voltage at the first end of the first switch; and the second diode allows a voltage at the second end of the second switch to never be lower than the voltage at the first end of the second switch.

* * * * *